United States Patent
Yoshino et al.

(10) Patent No.: US 6,812,702 B2
(45) Date of Patent: Nov. 2, 2004

(54) MAGNETIC RESONANCE IMAGING APPARATUS

(75) Inventors: Hitoshi Yoshino, Kashiwa (JP); Tsuneo Maeda, Tokyo (JP)

(73) Assignee: Hitachi Medical Corporation, Tokyo (JP)

( * ) Notice: Subject to any disclaimer, the term of this patent is extended or adjusted under 35 U.S.C. 154(b) by 0 days.

(21) Appl. No.: 10/312,760

(22) PCT Filed: Jul. 10, 2001

(86) PCT No.: PCT/JP01/05973
§ 371 (c)(1),
(2), (4) Date: Dec. 30, 2002

(87) PCT Pub. No.: WO02/03862
PCT Pub. Date: Jan. 17, 2002

(65) Prior Publication Data
US 2003/0110564 A1 Jun. 19, 2003

(30) Foreign Application Priority Data
Jul. 11, 2000 (JP) ................................ 2000-210125

(51) Int. Cl.[7] .............................................. G01V 3/00
(52) U.S. Cl. ........................................ 324/318; 324/309
(58) Field of Search ................................ 324/318, 319, 324/322, 309, 307; 600/410, 415; 335/306

(56) References Cited

U.S. PATENT DOCUMENTS

| | | | | |
|---|---|---|---|---|
| 4,985,678 A | * | 1/1991 | Gangarosa et al. | 324/318 |
| 5,305,749 A | * | 4/1994 | Li et al. | 600/415 |
| 5,495,222 A | * | 2/1996 | Abele et al. | 335/306 |
| 6,191,584 B1 | * | 2/2001 | Trequattrini et al. | 324/319 |
| 6,278,274 B1 | * | 8/2001 | Biglieri et al. | 324/318 |

FOREIGN PATENT DOCUMENTS

| | | |
|---|---|---|
| JP | A-8-50170 | 2/1996 |
| JP | A-10-135027 | 5/1998 |
| JP | A-11-104109 | 4/1999 |

* cited by examiner

Primary Examiner—Brij B. Shrivastav
(74) Attorney, Agent, or Firm—Antonelli, Terry, Stout & Kraus, LLP

(57) ABSTRACT

A magnetic resonance imaging apparatus configured using a single column for supporting magnet devices disposed above and below the apparatus, wherein peripheries of yokes covering the magnet devices are formed to be arcs, thereby improving openness and accessibility of an operator to an object under examination.

16 Claims, 5 Drawing Sheets

1

MAGNETIC RESONANCE IMAGING APPARATUS

TECHNICAL FIELD

The present invention relates to a static magnetic field generator suitable for application to an IVR using a magnetic resonance imaging apparatus.

BACKGROUND ART

Magnetic resonance imaging apparatuses obtain a tomographic image of an examined portion of an object under examination using a nuclear magnetic resonance phenomenon. In order to use the NMR phenomenon, there is a need to locate the object under examination in a static magnetic field. In order to generate the static magnetic field, magnets are employed. Among the magnets employed for this purpose are permanent magnets, superconductive magnets, or resistive magnets, and according to the direction of the magnetic field, the magnets are categorized into the ones of a horizontal magnetic field type and a vertical magnetic field type.

In recent years, an Interventional Radiology (IVR) operation is sometimes performed. In this operation, while carrying out a diagnosis, medical treatment is performed, and the magnetic resonance imaging apparatus is sometimes employed for the IVR operation. The IVR operation is performed by directly touching the object under examination being diagnosed, so that openness is required. For the magnetic resonance imaging apparatus that satisfies this requirement, a magnet of the vertical magnetic field type is employed. A prior art that uses the permanent magnet of the vertical magnetic field type will be described first.

Among magnetic resonance imaging apparatuses that use the permanent magnet, which particularly take openness into consideration are the ones disclosed in JP-A-8-50170 and JP-A-11-104109. In JP-A-8-50170, permanent magnets vertically disposed to face each other are supported by two yokes brought to one side of the apparatus, thereby enhancing openness in a space where the yokes are not disposed. In JP-A-11-104109, permanent magnets are supported by a single yoke, thereby enhancing openness.

Among magnetic resonance imaging apparatuses that use the superconductive magnet, which particularly takes openness into consideration, is the one disclosed in JP-A-10-135027. In JP-A-10-135027, superconductive magnets disposed to face each other are supported by at least two supporting means brought to one side of the apparatus, and at the same time, a ferromagnetic memberic material that prevents leakage flux is also brought to one side of the apparatus, thereby enhancing openness in a side where the supporting means and the ferromagnetic memberic material are not disposed.

In the prior arts described above, in order to enhance openness, the yokes and the supporting means are brought to one side of the apparatus or formed to be a single one. With this arrangement, however, access to the object under examination during the IVR operation is limited. Specifically, in the configuration disclosed in JP-A-8-50170 or JP-A-10-135027, where the two yokes or the supporting means (referred to as two columns) are brought to one side of the apparatus for supporting, a bed is inserted such that the object under examination passes through between the two columns. Alternatively, the bed is placed at the side of the two columns and then inserted horizontally. Hence, when inserting the bed between the two columns, access to the object under examination is limited to the one from the front side of the direction of insertion. On the other hand, when inserting the bed from the side of the two columns, access is limited to the one from one side. Accordingly, there may be a case where the IVR operation is performed in an uncomfortable posture of the operator. Furthermore, the number of operators, to a certain extent, would be limited.

On the other hand, in the configuration disclosed in JP-A-11-104109, where a single yoke (to be referred to as a single column) is employed for supporting, the object under examination is placed at the side of the single column, and the frames of the yoke disposed above and under the permanent magnets have the shape of a rectangle. For this reason, when the IVR operation is actually performed, if access to the object under examination from the corner of the rectangle is made, a distance to the object under examination will be increased, thereby limiting the position of the operator for making access.

DISCLOSURE OF THE INVENTION

In view of the problems described above, the present invention has been made with an object to improve accessibility of an operator to an object under examination during an IVR operation.

In order to achieve the object described above, a magnetic resonance imaging apparatus according to the present invention comprises:

permanent magnets disposed in opposition to each other with respect to a space formed therebetween sufficient to accommodate an object under examination, for generating a static magnetic field in a direction of the opposition, a static magnetic field space being generated in the space;

pole pieces disposed on sides of the permanent magnets facing the space, for improving uniformity;

yokes disposed outside the permanent magnets to be opposed each other with respect to the space; and a column for magnetically connecting the yokes;

wherein the column is formed with a single member, wherein peripheries of the permanent magnets and the pole pieces are formed to be circular or generally circular, and wherein the yokes comprise main body portions for mounting the permanent magnets thereto and protrusions joined to the column, and peripheries of the main body portions are formed to be arcs or like arcs so as to be aligned with the peripheries of the permanent magnets and the pole pieces. Further, the cross section of the column may be formed to be rectangular and has sides parallel to a line connecting the center of the column and the center of the static magnetic field, and the sides are made longer than sides perpendicular thereto. Still further, the column may be configured by laminating a plurality of ferromagnetic memberic plates. Further, the yokes may be thicker around the protrusions thereof for the column than in the portions thereof for the magnets.

Alternatively, a magnetic resonance imaging apparatus comprises:

superconductive magnets disposed being opposed each other with respect to a space formed therebetween sufficient to accommodate an object under examination, for generating a static magnetic field in the opposite direction, a static magnetic field space being formed in the space;

cryostats for surrounding the superconductive magnets, thereby cooling the superconductive magnets to a superconductive state and keeping the superconductive magnets in the superconductive state;

a connecting tube for coupling and supporting the cryostats;

first ferromagnetic member disposed outside the cryostats, being opposed each other with respect to the space; and a second ferromagnetic member for magnetically coupling and supporting the first ferromagnetic member;

wherein the connecting tube and the second ferromagnetic member respectively comprise a single member. Depending on the circumstances, a cover may cover the connecting tube and the second ferromagnetic member to form as a single support structure. The peripheries of the cryostats are formed to be circular, the first ferromagnetic member comprises main body portions for mounting the superconductive magnets thereto and projections for being joined to the second ferromagnetic member, and the peripheries of the main body portions are formed to be like arcs so as to be aligned with the peripheries of the cryostats. Further, it is also possible to construct the apparatus such that the cross section of the second ferromagnetic member is formed to be rectangular and has sides parallel to a line connecting the center of the second ferromagnetic member and the center of the static magnetic field, and the sides are made longer than sides perpendicular thereto.

The second ferromagnetic member may be configured by laminating a plurality of magnetic plates. Further, the first ferromagnetic members may be thicker in the protrusions than in the main body portions thereof.

Still further, the bed can be rotated with respect to the center of the static magnetic field. The bed can be disposed so that the body axis direction of the object under examination is substantially oriented toward the center of the static magnetic field space, and can be disposed in a position where the body axis direction of the object under examination lying down thereon is off an extended line connecting the center of the static magnetic field space and the center of the column, and is also off a line that passes through the center of the static magnetic field space and is perpendicular to the extended line.

According to the present invention, the column or the second ferromagnetic member of the magnetic resonance imaging apparatus comprises a single member. Further, the peripheries of the main body portions of the yokes or the first ferromagnetic member is formed to be circular. With this arrangment, openness is improved, and accessibility of an operator to an object under examination is improved. Further, by making the sides of the section of the column and the second ferromagnetic member oriented toward the center of the static magnetic field space to be longer than the sides perpendicular thereto, openness and accessibility can be more improved. In addition, by deflecting the direction of inserting the object under examination on the bed from a line connecting the center of the column or the second ferromagnetic member and the center of the static magnetic field space, the column and the second ferromagnetic member do not hinder the operator from performing medical treatments, so that access can be made. Still further, by rotating the bed with respect to the center of the static magnetic field space, access can be made irrespective of the number of operators and the types of operations.

BEST MODE FOR CARRYING OUT THE INVENTION

Embodiments of the present invention will be described hereafter with reference to appended drawings.

Figure 1:
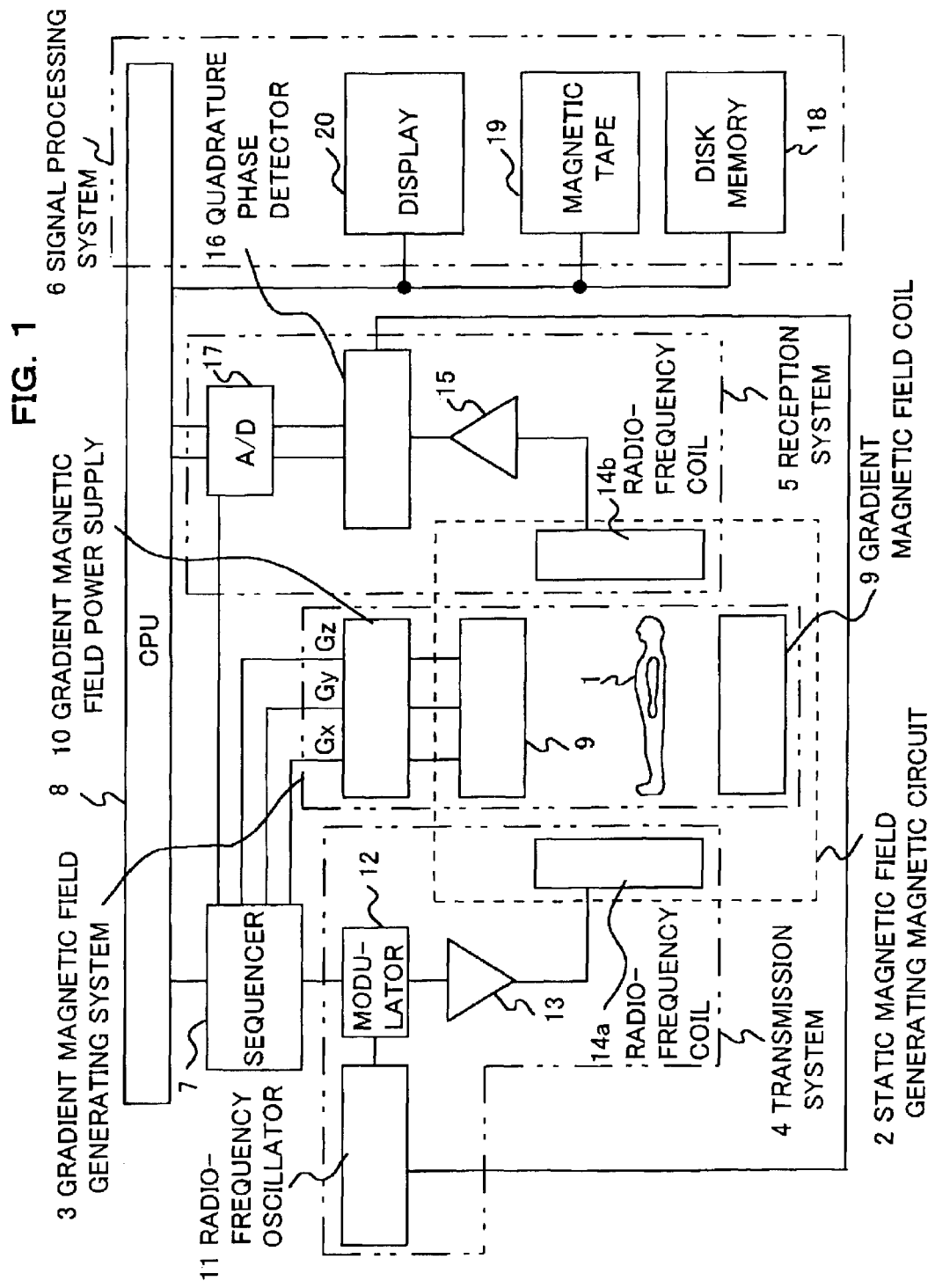
FIG. 1 is a block diagram showing an overall configuration of a magnetic resonance imaging apparatus according to the present invention.

First, an overall configuration of a magnetic resonance imaging apparatus according to the embodiments will be described with reference to FIG. 1. The magnetic resonance imaging apparatus according to the embodiments obtains the tomographic image of an object 1 under examination using a nuclear magnetic resonance (NMR) phenomenon. For this purpose, the apparatus comprises a static magnetic field generating magnetic circuit 2, a central processing unit (hereafter to be referred to as a CPU) 8, a sequencer 7, a transmission system 4, a gradient magnetic field generating system 3, a reception system 5, and a signal processing system 6.

The above-mentioned static magnetic field generating magnetic circuit 2 generates a uniform magnetic flux around the object 1 under examination in a body axis direction of the object 1 under examination or in a direction perpendicular to the body axis. In a space that extends around the above-mentioned object 1 under examination, magnetic field generating means of the type of the permanent magnet, the resistive magnet, or the superconductive magnet is disposed.

The above-mentioned sequencer 7 operates under control of the CPU 8, and transmits various commands necessary for collecting data on the tomographic image of the object 1 under examination to the transmission system 4, the gradient magnetic field generating system 3, and the reception system 5.

The above-mentioned transmission system 4 comprises a radio-frequency oscillator 11, a modulator 12, a radio-frequency amplifier 13, and a radio-frequency transmission coil 14a. The transmission system 4 performs amplitude modulation on radio-frequency pulses supplied from the above-mentioned radio-frequency oscillator 11 by the modulator 12 according to the command of the sequencer 7. After the radio-frequency pulses subjected to the amplitude modulation have been amplified by the radio-frequency amplifier 13, the amplified pulses are supplied to the radio-frequency coil 14a disposed close to the object 1 under examination. An electromagnetic wave is thereby irradiated to the above-mentioned object 1 under examination.

The above-mentioned gradient magnetic field generating system 3 comprises gradient magnetic field coils 9 wound in three directions of X, Y, and Z, and a gradient magnetic field power supply 10 for driving the respective coils. By driving the gradient magnetic field power supply 10 for the respective coils according to the command of the sequencer 7, gradient magnetic fields Gx, Gy, and Gz in the three directions of X, Y, and Z are applied to the object 1 under examination. A slice surface for the object 1 under examination can be set according to the way in which the gradient magnetic fields are applied.

The above-mentioned reception system 5 comprises a radio-frequency reception coil 14b, an amplifier 15, a quadrature phase detector 16, and an A–D converter 17. An electromagnetic wave (NMR signal) indicating a response of the object under examination to the electromagnetic wave radiated from the radio-frequency transmission coil 14a is detected by the radio-frequency coil 14b disposed close to the object 1 under examination, and supplied to the A–D converter 17 through the amplifier 15 and the quadrature phase detector 16 for conversion to a digital quantity. On this occasion, the A–D converter 17 samples two series of signals supplied from the quadrature phase detector 16 at a timing commanded by the sequencer 7, and then supplies two series of digital data. These digital signals are fed to a signal processing system 6 and subject to Fourier transformation.

The signal processing system 6 comprises a disk memory for performing data writing using the CPU 8, light, and magnetism, a recording device such as a magnetic tape 19, and a display 20 such as a CRT. The signal processing system 6 performs processing such as the Fourier transformation, a correction factor calculation, and an image reconstruction using the digital signals, and performs imaging of a signal strength distribution of an arbitrary section or a distribution obtained by performing appropriate operations on a plurality of signals, for display on the display 20.

Figure 2A:
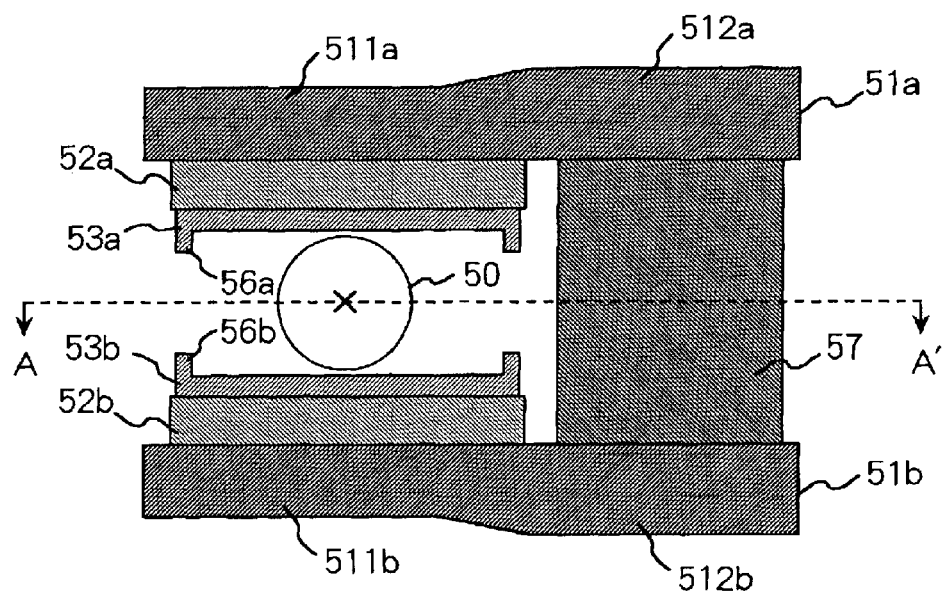
FIGS. 2A and 2B are diagrams showing a first embodiment of the present invention.
Figure 2B:
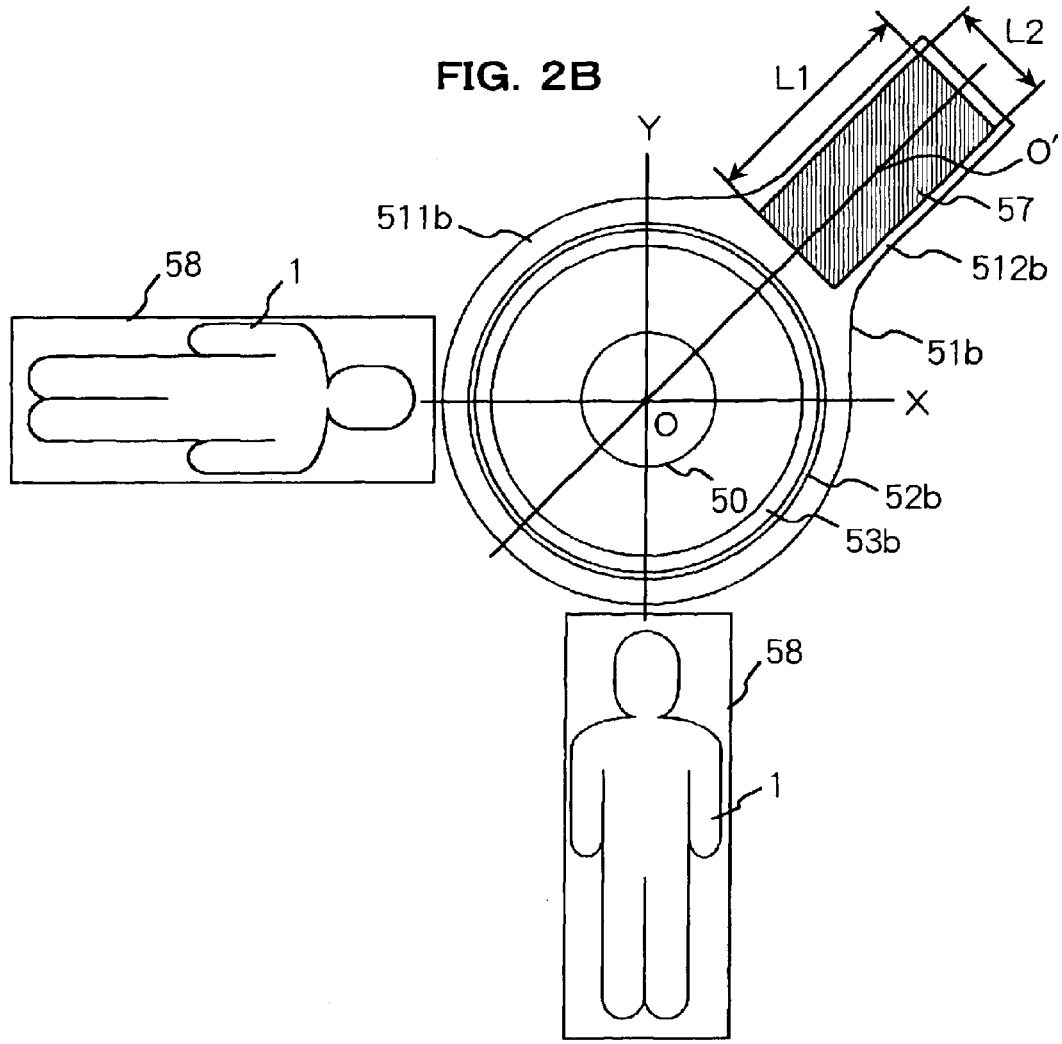
Figure 3:
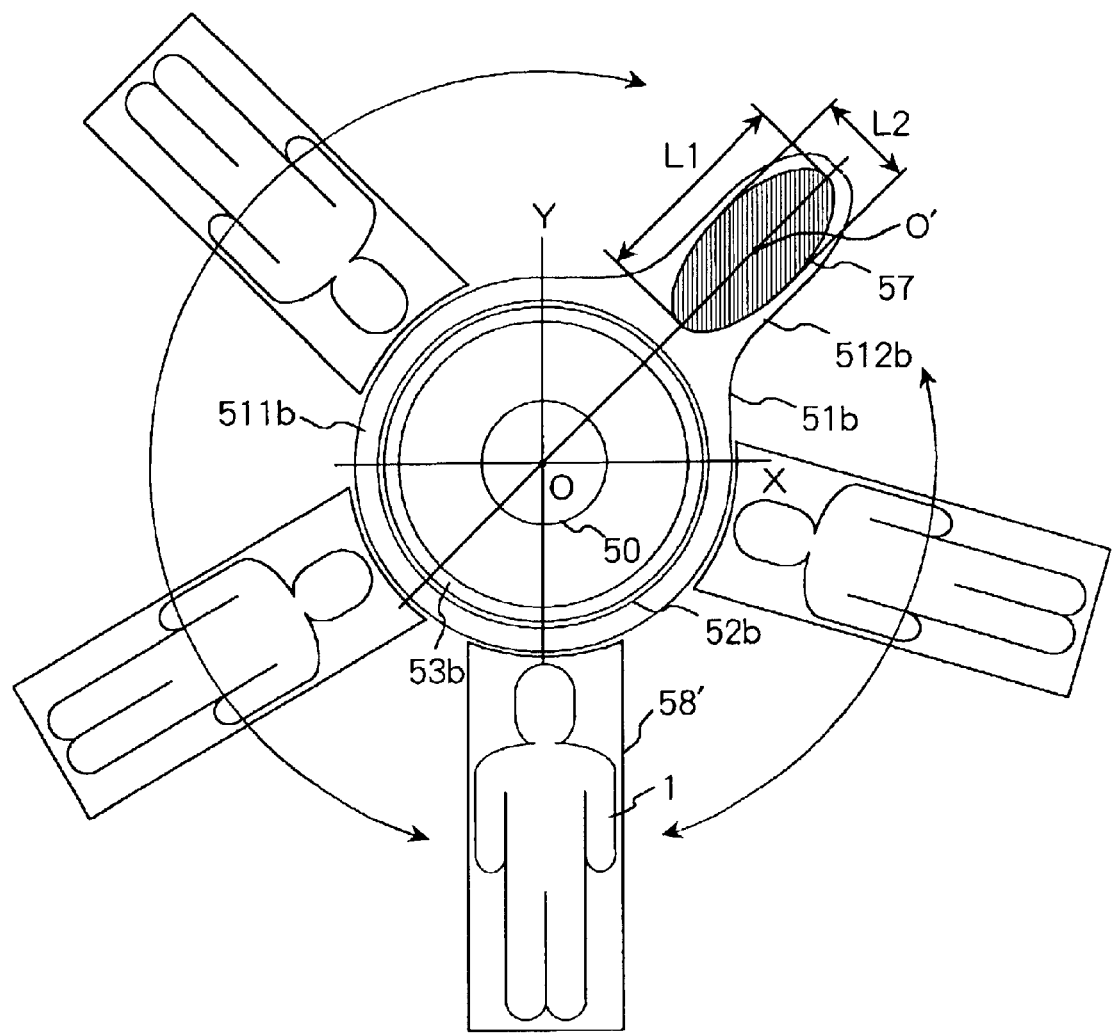
FIG. 3 is a diagram showing a first embodiment of the present invention.

Next, a first embodiment of the present invention will be described with reference to FIGS. 2A, 2B, and 3. FIG. 2B is a diagram showing a section along a line A–A' in FIG. 2A and a table arrangement. A pair of yokes 51a and 51b made of iron support permanent magnets 52a and 52b, and pole pieces 53a and 53b respectively so that the permanent magnets 52a and 52b are disposed to face each other and the pole pieces 53a and 53b are disposed to face each other. The yokes 51a and 51b are held by a single column 57 such that the yokes 51a and 51b are opposed, being separated apart by a predetermined distance to form a static magnetic field space therebetween.

That the permanent magnets 52a and 52b have different polarities, so that a magnetic circuit comprising, in this order, the permanent magnet 52a, the pole piece 53a, the pole piece 53b, the permanent magnet 52b, the yoke 51b, the column 57, the yoke 51a to the permanent magnet 52a is formed. The permanent magnets 52(a, b) are formed to be circular, and the pole pieces 53(a, b) formed to be circular are respectively disposed on the sides of the static magnetic field space defined by the permanent magnets 52(a, b). Both of the peripheral edges of the upper pole piece 53a and of the lower pole piece 53b have annular protrusions 56(a, b) of the same shape, respectively. The annular protrusions 56(a, b) serve to prevent leakage of the magnetic flux around the apparatus, thereby improving uniformity inside the space.

The yokes 51(a, b) comprise main body portions 511(a, b) for mounting the permanent magnets 52(a, b) thereto, and protrusions 512(a, b) for mounting the column 57 thereto. The main body portions 511(a, b) are formed to be aligned with the permanent magnets 52(a, b), while the protrusions 512 (a, b) are formed to be aligned with the column 57. The column 57 should be formed to have the shape of a circular cylinder or a prism. However, it is preferable that a length L1 of the column that extends in the direction of a line connecting a center O of a static magnetic field space 50 and a center O' of the column 57 is larger than a length L2 of the column perpendicular thereto. In other words, the column 57 should be formed be an elliptic cylinder or a rectangular prism. This allows the support strength of the yokes 51(a, b) to be sufficient. Furthermore, by shortening the above-mentioned orthogonal length L2 as much as possible in the column 57, the accessibility of an operator to the object 1 under examination is improved. However, it becomes necessary for the magnetic flux to be sufficiently passed through the column 57. In order to achieve this purpose, the cross-section area of the column should be increased. An increase in the length L1 of the column 57 in the direction that extends to the static magnetic field center O can ensure a desired sectional area. If the length L1 of the column 57 that extends to the static magnetic field center O cannot be made so long, the thickness of the protrusions 512(a, b) of the yokes 51(a, b) may also be increased to ensure the area of the section. Though the column 57 is configured to be a single-piece columnar body, a plurality of plate-like units may also be laminated to form a single column.

Further, a bed 58 for inserting the object 1 under examination can be disposed in a position off the line that passes through the center O' of the column 57 and the center O of the static magnetic field space 50 to get out of the way of the operator who performs the IVR operation or the like. If the directions of insertion of the object 1 under examination are denoted by an X axis and a Y axis, the column 57 is not disposed on the X nor Y axis. Thus, from the side of the apparatus or from the back of the apparatus, the operator can freely make access to the object 1 under examination inserted into the static magnetic field space 50 from outside the apparatus. Consequently, the operator can easily perform various treatments including the IVR operation and the like, in a comfortable posture.

The position of an operator may change according to the number of operators and the type of the operations. In order to cope with this change, a bed 58' may be so configured as to rotate along the periphery of the main body portion 511b of the yoke 51b with respect to the center O of the static magnetic space 50, as shown in FIG. 3. On this occasion, if the bed 58' is movable like a stretcher, a guide rail or the like may be provided for the periphery of the main body portion 511b of the yoke 51b so as to allow movement along the periphery of the main body portion 511b using the guide rail to which the bed is attached. Alternatively, if the bed 58' is fastened to the apparatus, a transfer mechanism may also be directly provided for the periphery of the main body portion 511b of the yoke 51b.

In this manner, by employing a single column 57 for the magnetic resonance imaging apparatus that uses the permanent magnet of the vertical magnetic field type, and forming the peripheries of the main body portions 511(a, b) of the yokes 51(a, b) to have a circular shape, the accessibility of the operator to the object 1 under examination during the IVR operation or the like is improved. Further, by forming the column 57 to be the elliptic cylinder or the rectangular prism, openness can be further enhanced. Still further, by allowing the bed 58 to be disposed in a position off the extended line that passes through the center O of the static magnetic field space 50 to the center O' of the column 57, the operability of the operator is further improved.

Figure 4A:
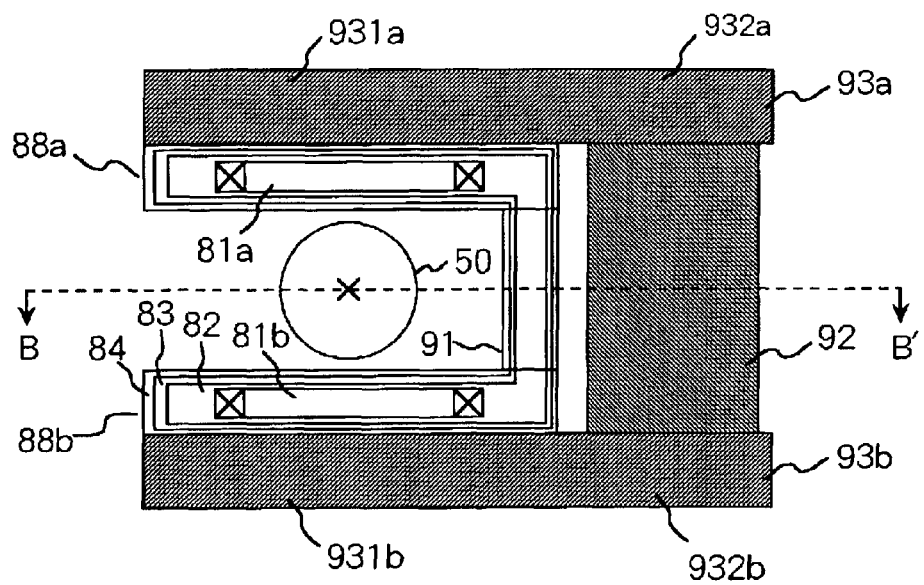
FIGS. 4A and 4B are diagrams showing a second embodiment of the present invention.
Figure 4B:
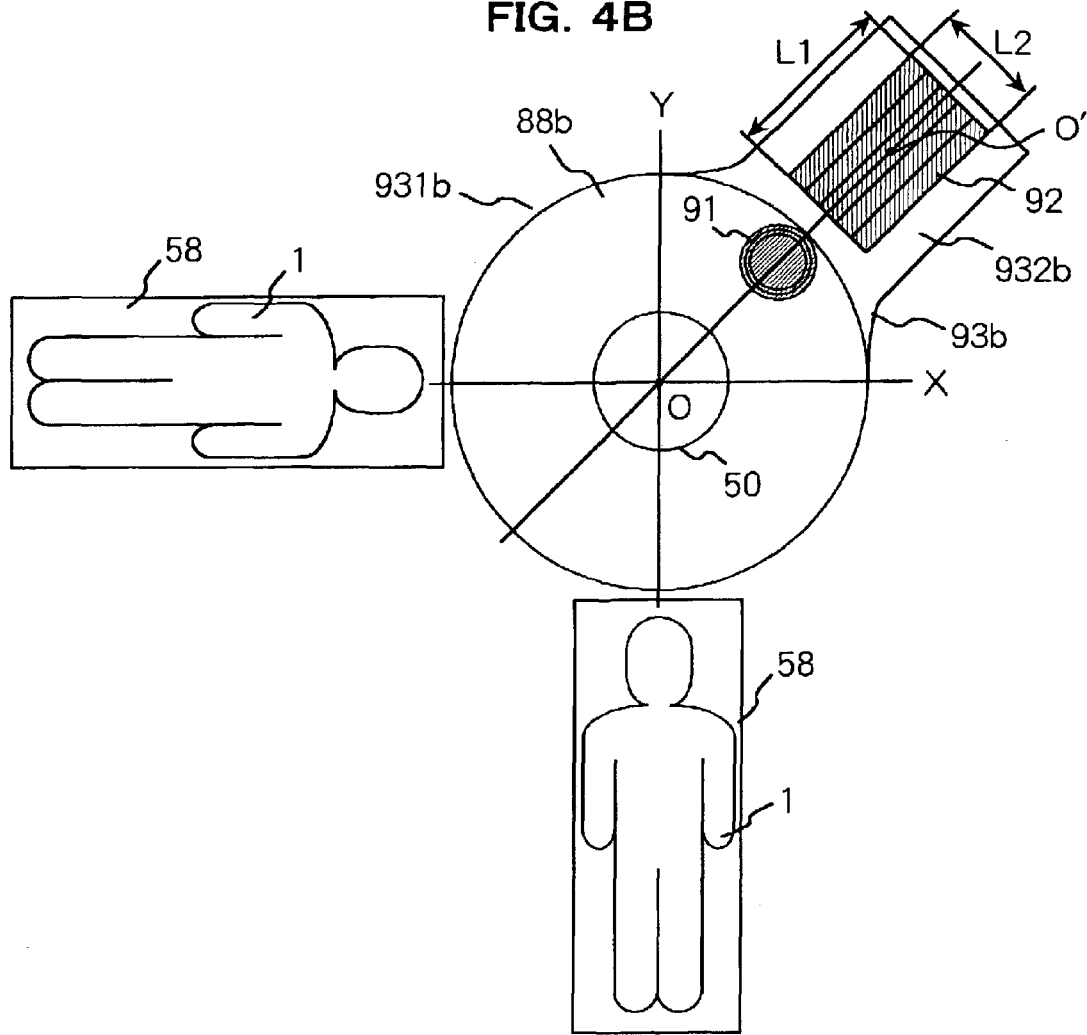

Next, a second embodiment of the present invention will be described with reference to FIGS. 3, 4A, and 4B. FIG. 4B is a diagram showing a section along a line B–B' in FIG. 4A and a table arrangement. Cryostats 88(a, b) for accommodating superconductive coils 81(a, b), which are sources for generating the magnetic field, are disposed to be vertically opposed, being symmetrical about the static magnetic field space 50. The superconductive coils, which are the sources for generating this magnetic field, are configured to generate a uniform, high-intensity magnetic field in the vertical direction of the static magnetic field space 50. The cryostats 88(a, b) for accommodating the circular superconductive coils are also shaped to be cylindrical and are vertically opposed, being symmetrical about the static magnetic field space 50. The cryostats 88(*a, b*) respectively comprise a vacuum chamber, a thermal shield, and a refrigerant. The cryostats 88(*a, b*) cool and keep the superconductive coils in the state of superconduction. The two cryostats 88(*a, b*) are supported by a single connecting tube 91 disposed therebetween, retaining a predetermined distance. The connecting tube 91 serves to mechanically support the upper and lower cryostats 88(*a, b*). As necessary, it may be so configured that the connecting tube 91 also serves to establish thermal connection between the upper and lower cryostats 88(*a, b*) (with liquid helium or the like employed as the refrigerant). In this case, the connecting tube 91 is constructed such that a refrigerant chamber 82 is disposed in the center thereof, and a thermal shield 83 and a vacuum chamber 84 are disposed around the refrigerant chamber, for example. With this arrangement, the need for providing a refrigerator for each of the upper and lower cryostats 88(*a, b*) is eliminated, so that it becomes possible that only a single refrigerator suffices a system.

On the other hand, in order to reduce magnetic field leakage to the outside of the apparatus caused by the magnetic flux generated by the superconductive coils, which are the sources of the magnetic field, magnetic shields made of iron are provided for the peripheries of the cryostats 88(*a, b*). Specifically, the upper portion of the upper cryostat 88*a* and the lower portion of the cryostat 88*b* are shielded by iron plates 93(*a, b*) corresponding to the yokes. In addition, the upper and lower iron plates 93(*a, b*) are magnetically connected by a single iron column (corresponding to the column) 92 formed of a plurality of column-like plates. The upper and lower cryostats 88(*a, b*) are fastened respectively to the upper and lower iron plates 93(*a, b*) by bolts. By shielding the circumferences of the sources for generating the magnetic field using a ferromagnetic memberic material such as iron, a magnetic path (return path) is formed for the magnetic flux generated outside the apparatus. For this reason, spreading of the leakage flux to a distance can be prevented. As the ferromagnetic memberic material to be employed in this embodiment, any material other than iron can also be selected, provided that it magnetically exhibits ferromagnetic memberism. However, in view of magnetic characteristics, cost, and mechanical strength, it is commonly preferable to employ iron.

The iron plates 93(*a, b*) comprise main body portions 931(*a, b*) for mounting the cryostats 88(*a, b*) thereto and protrusions 932(*a, b*) for mounting the iron column 92 thereto. The main body portions 931(*a, b*) are formed to be aligned with the cryostats 88(*a, b*), while the protrusions 932(*a, b*) are formed to be aligned with the iron column 92. The iron column 92 is formed to be a circular cylinder or a prism. However, it is preferable that the length L1 of the iron column 92 in the direction of a line connecting the center O of the static magnetic field space 50 and the center O' of the iron column 92 is made longer than the length L2 of the iron column perpendicular thereto. In other words, the iron column 92 should be formed to be an elliptic cylinder or a rectangular prism. This allows the support strength of the iron plates 93(*a, b*) to be sufficient. The thickness of the protrusions 932(*a, b*) of the iron plates 93(*a, b*) can be increased in view of the weight of the iron plates 93(*a, b*).

Alternatively, the connecting tube 91 and the iron column 92 may be covered with a cover to look like a single support post.

Further, the bed 58 for inserting the object 1 under examination can be disposed in a position off the line that passes through the center of the iron column 92 and the center O of the static magnetic field space to get out of the way of the operator who performs the IVR operation or the like. If the directions of insertion of the object 1 under examination are denoted by the X axis and the Y axis, the iron column 92 is not positioned on the X and Y axes. Thus, from the sides or back of the apparatus, the operator can freely access the object 1 under examination inserted into the static magnetic field space 50 from the outside of the apparatus. Consequently, the operator can easily perform various treatments including the IVR operation and the like, in a comfortable posture.

Figure 5:
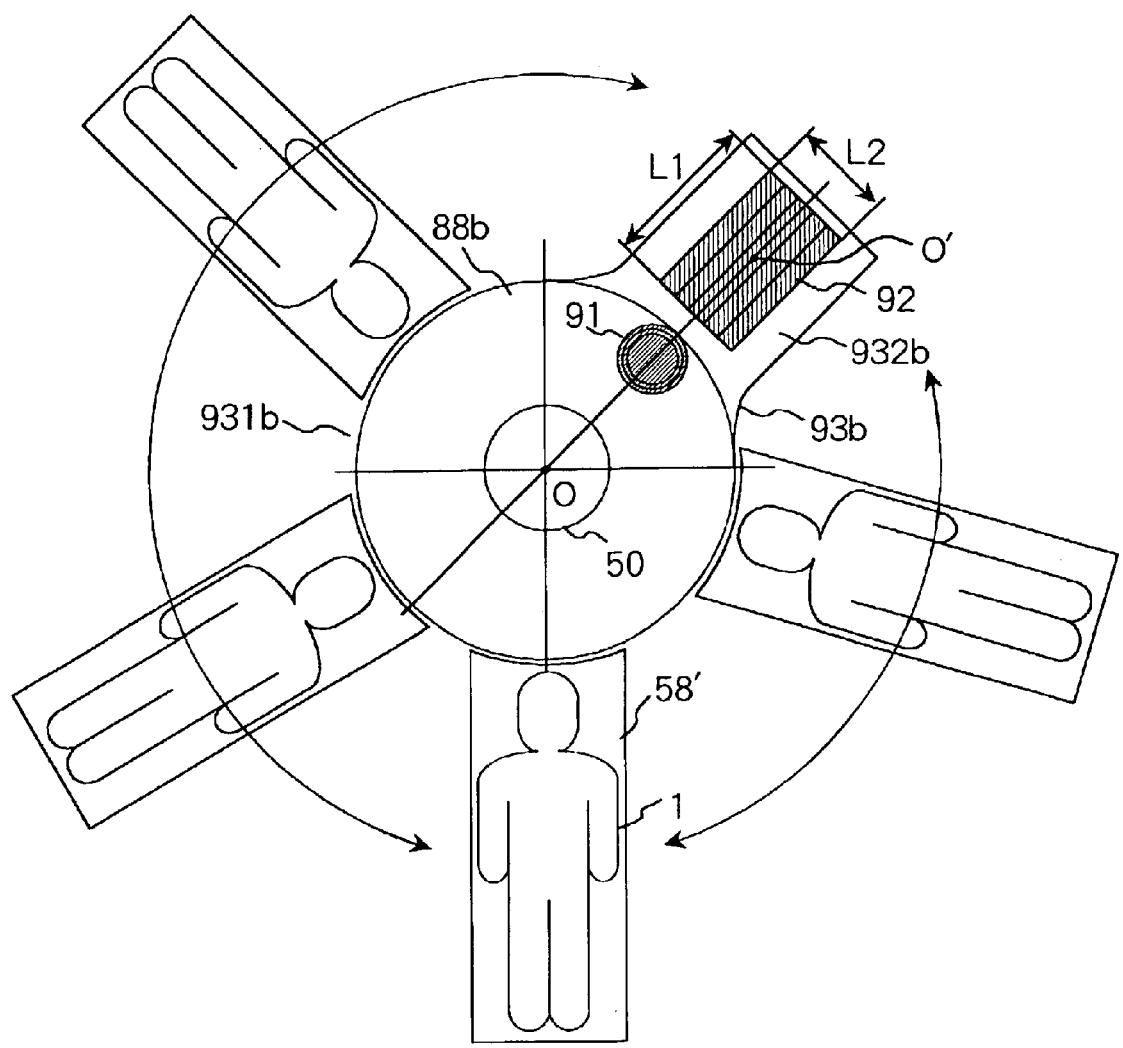
FIG. 5 is a diagram showing a second embodiment of the present invention.

The position of an operator may change according to the number of operators and the type of the operations. In order to cope with this change, the bed 58' may be formed to rotate along the periphery of the main body portion 932*b* of the iron plate 93*b* with respect to the center O of the static magnetic field space 50, as shown in FIG. 5. On this occasion, if the bed 58' is movable like the stretcher, the guide rail or the like may be provided for the periphery of the main body portion 931*b* of the iron plate 93*b* so as to allow movement along the periphery of the main body portion 931*b* using the guide rail to which the bed is attached. If the bed 58' is fastened to the apparatus, the transfer mechanism may be directly provided for the periphery of the main body portion 931*b* of the iron plate 93*b*.

By employing a single iron column 92 and a single connecting tube 91 for the magnetic resonance imaging apparatus that employs the superconductive magnets of the vertical magnetic field type and forming the peripheries of the main body portions 931(*a, b*) of the iron plates 93(*a, b*) to be circular, the accessibility of the operator to the object under examination during the IVR operation or the like is improved. Further, by forming the section of the iron column 92 to have the shape of the elliptic cylinder or the rectangular prism, openness can be further enhanced. Still further, by shifting the position of the bed 58 off the extension of the line that passes through the center O of the static magnetic field space 50 and the center O' of the iron column 92, the operability of the operator is further improved.

To take an example, the bed can be disposed so that an angle formed between the line connecting the center of the static magnetic field space and the center O' of the iron column 92 and a line connecting the center of the static magnetic field space and the center of the bed ranges from 45° to 135° or from 225° to 315°. The same scheme applies to FIG. 2B as well.

What is claimed is:

1. A magnetic resonance imaging apparatus comprising:
   permanent magnets disposed in opposition to each other with respect to a space sufficient to accommodate an object under examination formed therebetween, for generating a static magnetic field in a direction perpendicular to a body axis of the object under examination;
   pole pieces disposed on sides of the permanent magnets facing the space, for improving uniformity;
   yokes disposed outside the permanent magnets to be opposed each other with respect to the space; and
   a column for magnetically connecting the yokes;
   wherein the column comprises a single member,
   wherein peripheries of the permanent magnets and the pole pieces are formed to be circular or generally circular, and
   wherein the yokes comprise main body portions for mounting the permanent magnets thereto and protrusions joined to the column, and peripheries of the main body portions are formed to be arcs or like arcs so as to be aligned with the permanent magnets and the pole pieces.

2. The magnetic resonance imaging apparatus according to claim 1, wherein a cross section of the column is formed to be rectangular, the cross section has sides parallel to a line connecting a center of the column and a center of the static magnetic field, and the sides are made longer than sides perpendicular thereto.

3. The magnetic resonance imaging apparatus according to claim 1, wherein a cross section of the column is formed to be an ellipse, and a longer diameter of the ellipse is disposed in a location that coincides with a line connecting a center of the column and a center of the static magnetic field.

4. The magnetic resonance imaging apparatus according to claim 1, wherein the column is configured by laminating a plurality of ferromagnetic memberic plates.

5. The magnetic resonance imaging apparatus according to claim 1, wherein the yokes are thicker near the column than in the main body portions thereof.

6. The magnetic resonance imaging apparatus according to claim 1, further comprising a bed capable of being rotated in a horizontal direction with respect to a center of the static magnetic field and capable of being disposed so that a body axis direction of the object under examination is substantially oriented toward the center of the static magnetic field.

7. A magnetic resonance imaging apparatus comprising:
superconductive magnets disposed in opposition to each other with respect to a space sufficient to accommodate an object under examination formed therebetween, for generating a static magnetic field in a direction perpendicular to a body axis of the object under examination;
cryostats disposed in opposition to each other for surrounding the superconductive magnets, thereby cooling the superconductive magnets to a superconductive state and keeping the superconductive magnets in the superconductive state;
a connecting tube for connecting and supporting the cryostats;
first ferromagnetic member disposed outside the cryostats to be opposed each other with respect to the space; and
a second ferromagnetic member for magnetically connecting and supporting the first ferromagnetic member;
wherein the connecting tube and the second ferromagnetic member respectively comprises a single member.

8. The magnetic resonance imaging apparatus according to claim 7, wherein a cross section of the second ferromagnetic member is formed to be rectangular, the cross section has sides parallel to a line connecting a center of the second ferromagnetic member and a center of the static magnetic field, and the sides are made longer than sides perpendicular thereto.

9. The magnetic resonance imaging apparatus according to claim 7, wherein a cross section of the second ferromagnetic member is formed to be an ellipse, and a longer diameter of the ellipse is disposed in a location that coincides with a line connecting a center of the second ferromagnetic member and a center of the static magnetic field.

10. The magnetic resonance imaging apparatus according to claim 7, wherein the second ferromagnetic member is configured by laminating a plurality of ferromagnetic memberic plates.

11. The magnetic resonance imaging apparatus according to claim 7, wherein the first ferromagnetic member is thicker near the second ferromagnetic member than in the main body portions thereof.

12. The magnetic resonance imaging apparatus according to claim 7, further comprising a cover for covering the connecting tube and the second ferromagnetic member to form a single support structure member for the upper and lower superconductive magnets.

13. The magnetic resonance imaging apparatus according to claim 7, further comprising:
a bed capable of being rotated in a horizontal direction with respect to a center of the static magnetic field and capable of being disposed so that a body axis direction of the object under examination is substantially oriented toward the center of the static magnetic field.

14. A magnetic resonance imaging apparatus comprising:
a pair of magnet devices vertically disposed, in opposition to each other with respect to a static magnetic field space formed therebetween for accommodating an object under examination, the pair of magnet devices having a circular outer shape;
a single support structure member coupled to one end portion of the magnet devices, for supporting the magnet devices; and
a bed movably connected to a periphery of one of the pair of magnet devices, said bed being rotatable along the periphery of the one of the pair of magnet devices in a horizontal direction with respect to a center of the static magnetic field space.

15. A magnetic resonance imaging apparatus comprising:
a pair of magnet devices vertically disposed in opposition to each other, for forming a static magnetic field space therebetween;
a single support structure member coupled to one ends of the magnet devices, for supporting the pair of magnet devices; and
a bed for carrying and transferring the object under examination to a center of the static magnetic field space, the bed being movably connected toward a periphery of one of the pair of magnet devices so that a longitudinal direction of the bed is directed to a center of the static magnetic field space and rotatable along the periphery of the one of the pair of magnet devices;
wherein the bed is positioned so that the object under examination is transferred in a direction other than a direction of an extended line connecting the center of the static magnetic field space and a center of the single support structure member.

16. A magnetic resonance imaging apparatus comprising:
a pair of magnet devices vertically disposed in opposition to each other for forming a static magnetic field space therebetween;
a single support structure member coupled to one ends of the pair of magnet devices, for supporting the pair of magnet devices; and
a bed for carrying and transferring the object under examination lying down thereon to a center of the static magnetic field space, the bed being movably connected to a periphery of one of the pair of magnet devices so that a longitudinal direction of the bed is directed toward a center of the static magnetic field space and rotatable along the periphery of the one of the pair of magnet devices;
wherein the bed is positioned so that an angle formed between a line connecting the center of the static magnetic field space and a center of the single support structure member and a line connecting the center of the static magnetic field space and a center of the bed is in the ranges from 45 to 135 degrees or from 225 to 315 degrees.

* * * * *